(12) United States Patent
Lam

(10) Patent No.: US 8,525,329 B2
(45) Date of Patent: Sep. 3, 2013

(54) COMPONENT STACKING FOR INTEGRATED CIRCUIT ELECTRONIC PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/538,924

(22) Filed: Jun. 29, 2012

(65) Prior Publication Data
US 2012/0270367 A1    Oct. 25, 2012

Related U.S. Application Data

(63) Continuation of application No. 12/015,122, filed on Jan. 16, 2008, now Pat. No. 8,237,266, which is a continuation of application No. 11/314,674, filed on Dec. 20, 2005, now Pat. No. 7,342,308.

(51) Int. Cl.
    *H01L 23/34*    (2006.01)

(52) U.S. Cl.
    USPC ........... 257/724; 257/E25.027; 257/686; 257/777; 438/107; 438/109

(58) Field of Classification Search
    USPC ........... 257/E21.506, 685, 686, 723, 777, 257/778, E25.027; 438/107, 109, 110
    See application file for complete search history.

(56) References Cited

U.S. PATENT DOCUMENTS

| | | | |
|---|---|---|---|
| 5,220,489 A | 6/1993 | Barreto et al. | |
| 5,229,960 A * | 7/1993 | De Givry | 365/63 |
| 5,570,273 A | 10/1996 | Siegel et al. | |
| 6,153,290 A | 11/2000 | Sunahara | |
| 6,229,218 B1 | 5/2001 | Casey et al. | |
| 6,323,096 B1 | 11/2001 | Saia et al. | |
| 6,353,263 B1 * | 3/2002 | Dotta et al. | 257/777 |
| 6,403,881 B1 | 6/2002 | Hughes | |
| 6,407,456 B1 * | 6/2002 | Ball | 257/777 |
| 6,424,034 B1 | 7/2002 | Ahn et al. | |
| 6,618,267 B1 | 9/2003 | Dalal et al. | |
| 6,630,661 B1 | 10/2003 | Hoffman | |

(Continued)

FOREIGN PATENT DOCUMENTS

| | | |
|---|---|---|
| EP | 1439581 | 7/2004 |
| TW | 1230426 | 4/2005 |

(Continued)

OTHER PUBLICATIONS

U.S. Appl. No. 11/315,409, Final Office Action mailed Aug. 12, 2008 (8 pages).

(Continued)

*Primary Examiner* — Chris Chu
(74) *Attorney, Agent, or Firm* — Fish & Richardson P.C.

(57) ABSTRACT

Component stacking for increasing packing density in integrated circuit packages. In one aspect of the invention, an integrated circuit package includes a substrate, and a plurality of discrete components connected to the substrate and approximately forming a component layer parallel to and aligned with a surface area of the substrate. An integrated circuit die is positioned adjacent to the component layer such that a face of the die is substantially parallel to the surface area of the substrate. The face of the die is aligned with at least a portion of the component layer, and terminals of the die are connected to the substrate.

13 Claims, 3 Drawing Sheets

(56) References Cited

U.S. PATENT DOCUMENTS

| | | | |
|---|---|---|---|
| 6,653,725 B2 | 11/2003 | Ahn et al. | |
| 6,664,643 B2 * | 12/2003 | Emoto | 257/777 |
| 6,674,173 B1 | 1/2004 | Wang | |
| 6,734,539 B2 | 5/2004 | Degani et al. | |
| 6,774,492 B2 | 8/2004 | Ahn et al. | |
| 6,853,944 B2 | 2/2005 | Fan | |
| 6,930,378 B1 * | 8/2005 | St. Amand et al. | 257/686 |
| 6,946,922 B2 | 9/2005 | Takemura et al. | |
| 6,998,721 B2 * | 2/2006 | Zhou | 257/790 |
| 7,005,325 B2 | 2/2006 | Chow et al. | |
| 7,023,288 B2 | 4/2006 | Takanashi et al. | |
| 7,064,430 B2 | 6/2006 | Chow et al. | |
| 7,109,576 B2 | 9/2006 | Bolken et al. | |
| 7,132,753 B1 | 11/2006 | St. et al. | |
| 7,175,606 B2 | 2/2007 | Bowman et al. | |
| 7,205,656 B2 | 4/2007 | Kim et al. | |
| 7,242,101 B2 | 7/2007 | Ararao et al. | |
| 7,342,308 B2 | 3/2008 | Lam | |
| 7,586,184 B2 | 9/2009 | Hung et al. | |
| 7,622,325 B2 * | 11/2009 | Shim et al. | 438/106 |
| 7,723,831 B2 | 5/2010 | Kwang et al. | |
| 7,732,252 B2 | 6/2010 | Chow et al. | |
| 7,750,247 B2 | 7/2010 | Chikagawa et al. | |
| 7,772,685 B2 * | 8/2010 | Huang et al. | 257/686 |
| 7,791,192 B1 | 9/2010 | Joshi et al. | |
| 7,821,122 B2 | 10/2010 | Lam | |
| 7,906,852 B2 * | 3/2011 | Nishimura et al. | 257/777 |
| 8,008,763 B2 * | 8/2011 | Yoshimura et al. | 257/686 |
| 8,288,201 B2 * | 10/2012 | Pagaila et al. | 438/107 |
| 2002/0066593 A1 | 6/2002 | Burdon et al. | |
| 2002/0086500 A1 | 7/2002 | Wu et al. | |
| 2002/0096785 A1 * | 7/2002 | Kimura | 257/778 |
| 2002/0127775 A1 | 9/2002 | Haba et al. | |
| 2002/0140085 A1 * | 10/2002 | Lee et al. | 257/724 |
| 2002/0185744 A1 | 12/2002 | Katagiri et al. | |
| 2003/0038374 A1 * | 2/2003 | Shim et al. | 257/777 |
| 2003/0189259 A1 * | 10/2003 | Kurita et al. | 257/777 |
| 2004/0145040 A1 * | 7/2004 | Fukuda et al. | 257/687 |
| 2004/0238857 A1 | 12/2004 | Beroz et al. | |
| 2005/0135041 A1 | 6/2005 | Kang et al. | |
| 2005/0258529 A1 | 11/2005 | Green et al. | |
| 2006/0012037 A1 | 1/2006 | Raedt et al. | |
| 2006/0113679 A1 | 6/2006 | Takatsu et al. | |
| 2006/0145339 A1 | 7/2006 | Yang et al. | |
| 2006/0245308 A1 | 11/2006 | Macropoulos et al. | |
| 2007/0007643 A1 | 1/2007 | Oh et al. | |
| 2007/0070608 A1 | 3/2007 | Warren et al. | |
| 2007/0138629 A1 | 6/2007 | Lam | |
| 2007/0145562 A1 | 6/2007 | Lam | |
| 2008/0251875 A1 | 10/2008 | Wu et al. | |
| 2008/0280396 A1 | 11/2008 | Kim et al. | |

FOREIGN PATENT DOCUMENTS

| | | |
|---|---|---|
| TW | 1233196 | 5/2005 |
| TW | 1239059 | 9/2005 |
| TW | 1245407 | 12/2005 |
| WO | 2004003980 | 1/2004 |
| WO | 2007075648 | 7/2007 |
| WO | 2007076020 | 7/2007 |

OTHER PUBLICATIONS

U.S. Appl. No. 11/315,409, Final Office Action mailed Sep. 1, 2009 (10 pages).

U.S. Appl. No. 11/315,409, Non-Final Office Action mailed Nov. 21, 2008 (7 pages).

U.S. Appl. No. 11/315,409, Response filed May 21, 2009 to Non-Final Office Action mailed Nov. 21, 2008 (11 pages).

U.S. Appl. No. 11/315,409, Response filed Nov. 12, 2008 to Final Office Action mailed Aug. 12, 2008 (10 pages).

International Application No. PCT/US2006/48376, International Search Report and Written Opinion mailed Sep. 25, 2008 (12 pages).

U.S. Appl. No. 11/315,409, Final Office Action mailed Feb. 24, 2010 (7 pages).

U.S. Appl. No. 11/315,409, Notice of Allowance mailed Apr. 5, 2010 (7 pages).

U.S. Appl. No. 11/315,409, Response filed Mar. 1, 2010 to Non-Final Office Action mailed Feb. 24, 2010 (10 pages).

International Application No. PCT/US2006/49043, International Search Report mailed Mar. 31, 2008 (3 pages).

Taiwan Application Serial No. 095147577, Office Action mailed Sep. 29, 2009 (5 pages).

U.S. Appl. No. 11/315,409, Notice of Allowance mailed Jul. 15, 2010 (8 pages).

U.S. Appl. No. 11/315,409, Supplemental Notice of Allowability mailed Jun. 3, 2010 (5 pages).

* cited by examiner

COMPONENT STACKING FOR INTEGRATED CIRCUIT ELECTRONIC PACKAGE

CROSS-REFERENCE TO RELATED APPLICATIONS

Under 35 USC §120, this application is a continuation application and claims the benefit of priority to U.S. patent application Ser. No. 12/015,122, filed Jan. 16, 2008, entitled "Component Stacking for Integrated Circuit Electronic Package," which in turn is a continuation of and claims the benefit of priority to U.S. patent application Ser. No. 11/314,674, filed Dec. 20, 2005, entitled "Component tacking for Integrated Circuit Electronic Package," and is related to co-pending patent application Ser. No. 11/315,409, filed Dec. 22, 2005, entitled "Method and System for Increasing Circuitry Interconnection and Component Capacity in a Multi-Component package," all of which are incorporated herein by reference in their entirety.

FIELD OF THE INVENTION

The present invention relates to integrated circuit electronics packages, and more particularly to the layout and packing density of components in an integrated circuit electronics package.

BACKGROUND OF THE INVENTION

A multi-component electronic package or module for integrated circuits typically includes one or more integrated circuit devices and discrete passive and active components. For example, the integrated circuit devices can be in the form of integrated circuit dice which include terminals that contact conductive pads of the package circuits using bonding wires, solder flip-chip attach, or other structures. The discrete components can include passive devices such as resistors, capacitors, and inductors, as well as active components such as memory devices, crystals (e.g., for clock signals), radios, or other devices. The discrete components are included in the same package as the integrated circuit die or dice to provide a multi-function module, or in some cases a complete system in a package (SIP).

In some integrated circuit packages, multiple dice are included. In a typical configuration, the first die is attached to the package substrate, e.g., using epoxy polymer as adhesive and wirebonding for electrical connections, or, alternatively using flip-chip technology to contact the substrate. Additional dice, of similar or dissimilar size, are stacked on top of the first die and on top of each other to increase the packing density of the package.

The discrete components of the integrated circuit package, however, are positioned along the sides of the dice and are attached to conductive pads. The positioning of the discrete components around the perimeter of the dice leads to wider and longer packages. Thus, packing density is overall decreased, and the packages use a large amount of area to house the discrete components. Furthermore, additional contact pads must be added on the substrate around the die so that the discrete components may be electrically attached to the package circuits.

Accordingly, what is needed is a method and system for reducing the package density of integrated circuit packages that include discrete components. The present invention addresses such a need.

SUMMARY OF THE INVENTION

The invention of the present application relates to stacking components to increase packing density in integrated circuit packages. In one aspect of the invention, an integrated circuit package includes a substrate, and a plurality of discrete components connected to the substrate and approximately forming a component layer parallel to and aligned with a surface area of the substrate. An integrated circuit die is positioned adjacent to the component layer such that a face of the integrated circuit die is substantially parallel to the surface area of the substrate. The face of the integrated circuit die is aligned with at least a portion of the component layer, and terminals of the integrated circuit die are connected to the substrate.

In another aspect of the invention, a method for forming an integrated circuit package includes placing a plurality of discrete components on a surface area of a substrate to approximately form a component layer parallel to the surface area of the substrate. An integrated circuit die is placed on the component layer such that a face of the integrated circuit die is substantially parallel to the surface area of the substrate, and the face of the integrated circuit die is aligned with at least a portion of the component layer. Terminals of the integrated circuit die are connected to the substrate.

In another aspect of the invention, an integrated circuit package includes a substrate; a plurality of discrete components connected to a surface of the substrate, and an integrated circuit die positioned over at least a portion of the discrete components, where terminals of the integrated circuit die are connected to the substrate.

The present invention provides a packing configuration that increases the packing density of an integrated circuit electronics package. By placing an integrated circuit die over or adjacent to a discrete component layer in the package, surface area of the package is saved, allowing smaller integrated circuit packages to be produced.

DETAILED DESCRIPTION

The present invention relates to integrated circuit electronics packages, and more particularly to the layout and packing density of components in an integrated circuit electronics package. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular systems provided in particular implementations. However, one of ordinary skill in the art will readily recognize that this method and system will operate effectively in other implementations. The present invention will also be described in the context of particular methods having certain steps. However, the method and system operate effectively for other methods having different and/or additional steps not inconsistent with the present invention.

To more particularly describe the features of the present invention, please refer to FIGS. 1 through 4 in conjunction with the discussion below.

Figure 1A:
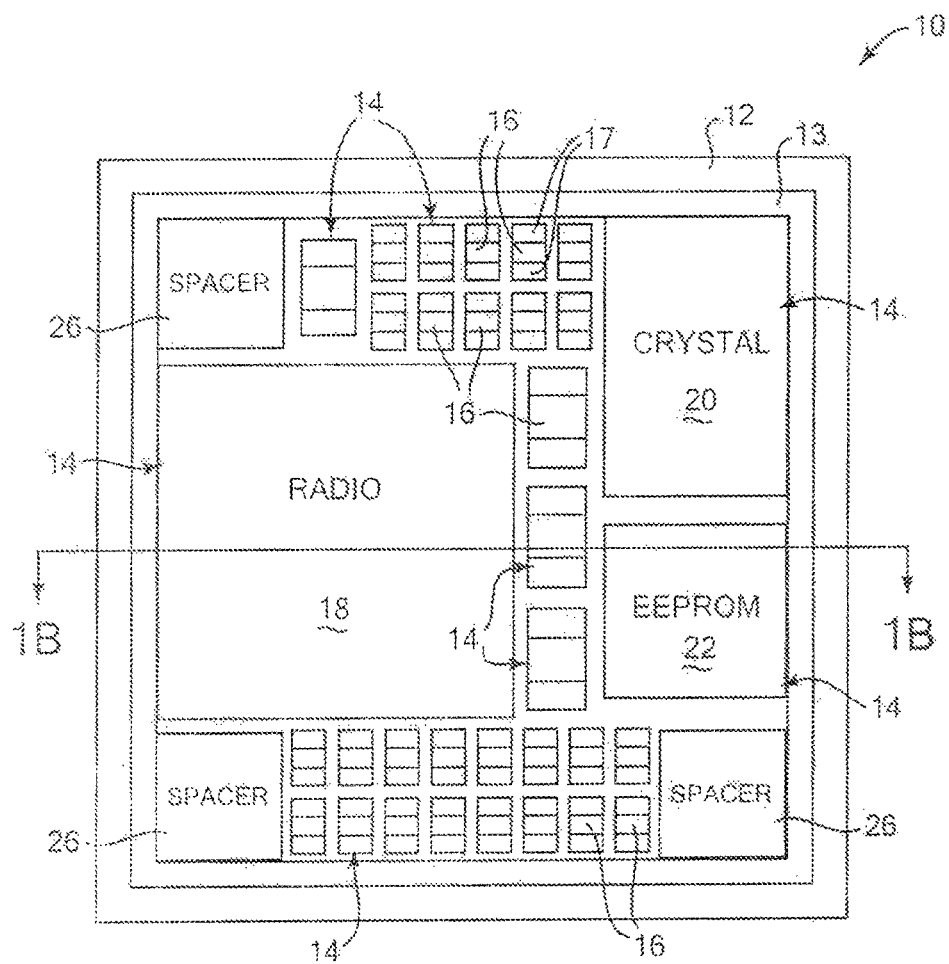
FIGS. 1A and 1B are top plan and side elevation views, respectively, of a portion of an integrated circuit package 10 according to the present invention.
Figure 1B:
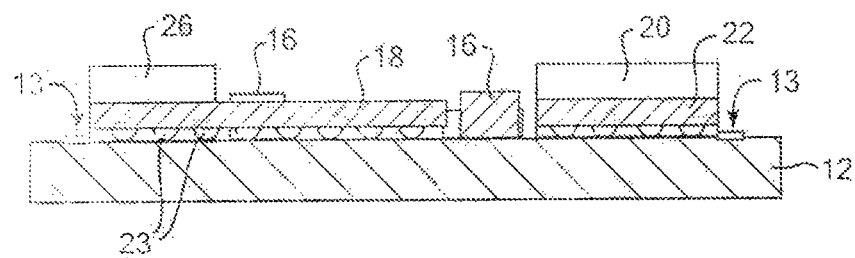

FIGS. 1A and 1B are top plan and side elevation views, respectively, of a portion of an integrated circuit package 10 according to the present invention. Package 10 includes a substrate 12 and discrete components 14. Substrate 12 is the base on which the integrated circuit package is constructed, and can be made of silicon, gallium arsenide, or other material. A row 13 of pads or conductive elements can be positioned near the outer perimeter of the substrate 12 which is to be used to connect to the leads or terminals of the integrated circuit (IC) die that is to be included in the package 10 (shown in FIGS. 2A-2B).

Discrete components 14 are included in package 10 to provide additional functionality and support for the IC 18 and/or the IC die 50. The components 14 are coupled to the substrate 12 via connection pads or terminals (not shown) on the substrate, for example using standard solder connections, ball grid array connections, etc. The connection pads are formed as part of the electronic package interconnects substrate 12 and can be made of conductive metal, conductive epoxy, or other conductive material. The discrete components 14 together approximately form a kind of "component layer" on the substrate 12 that is parallel to and aligned with the surface area of the substrate over which the discrete components are positioned.

Discrete components 14 can include passive components, such as resistors 16. In the example shown, surface-mount resistors 16 are provided, each resistor including two terminals 17 which are soldered to connection pads underneath the resistors. In other embodiments, other passive components can alternatively or additionally be used, such as capacitors, inductors, baluns, switches, filters, etc.

The discrete components 14 may also include active components, including such devices as integrated circuit devices. In the example of FIG. 1A, the active components include a radio chip 18, a crystal 20, and an Electrically Erasable Read Only Memory (EEPROM) device 22. Radio chip 18 can perform radio functions, such as transmission and/or reception of radio signals, and process those signals. Crystal 20 can generate a clock signal for use with other components and circuits of the package 10, such as radio chip 18. EEPROM 22 can be used as memory for the integrated circuit die(s) of the package, and/or for other components if appropriate. Other types of memory can also be provided in package 10 as discrete components, such as Random Access Memory (RAM), Read-Only Memory (ROM), flash memory, etc. The active discrete components can be attached to the conductive pads of the substrate 14 using ball grid connections 23, as shown, or other types of connections, such as wirebonding and conductive epoxy terminal connections.

Figure 2A:
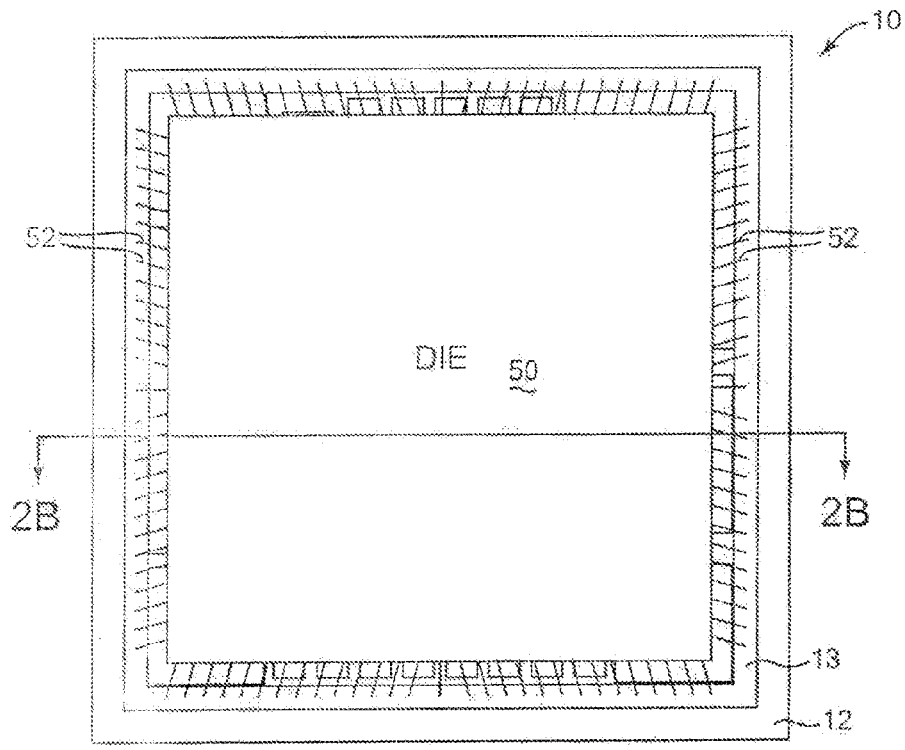
FIGS. 2A and 2B are top plan and side elevation views of the integrated circuit package of FIGS. 1A-1B, including an integrated circuit die.
Figure 2B:
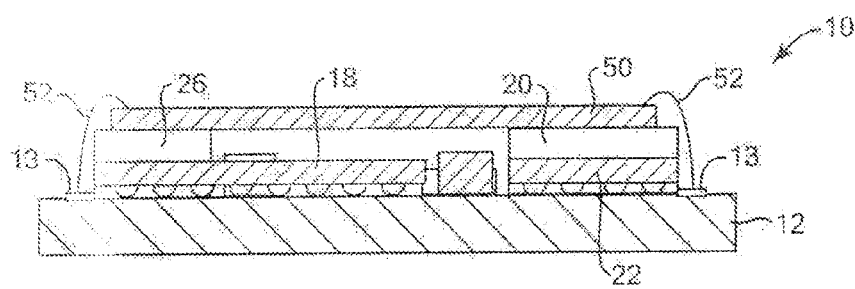

The discrete components 14 of the package 10 are arranged in the present invention so as to provide a stable platform for an integrated circuit die that is placed over the discrete components (shown in FIGS. 2A-2B).

In the described embodiment, the tallest of the discrete components are placed in the four corners of the substrate 12 in accordance with the dimensions of the integrated circuit die, and within the rows 13 of conductive pads. In the described example, the crystal 20 component is the tallest of the discrete components 14. If, for example, the face or area of the integrated circuit die is smaller than the area of the component layer, then the four tallest components are placed in the corners of an area the size of the integrated circuit die, and that area can be positioned anywhere within the component layer area, e.g., at the center, in a corner, or at the side of the component layer (the attachment pads 13 of the substrate may have to be adjusted in position to be close to the edges of the die). If there are greater than four tallest discrete components, the additional tallest components can be placed in additional areas such as the center or edges of the area to be covered by the die.

If there are less than four tallest discrete components of the same height in the component layer, then dummy spacers 26 can be positioned on the substrate 12 in corners of the substrate 12 to make up the difference. This allows four level surfaces to be positioned to receive the integrated circuit die, and forms a stable surface platform for the die. For example, in the example of FIG. 1A-1B, there is a single tallest component, crystal 20, which has been placed in one corner of the substrate. Spacers 26 having the same height as the tallest component (crystal 20) are positioned in the other three corners. Spacers 26 can be made of any suitable material compatible with the package 10, e.g., silicon, copper, polymer material, etc. In other embodiments, none of the components 14 of the component layer need be used as supports for the die 50, and only spacers 26 can provide the support for the die 50.

If there are more discrete components 14 in the package 10 than can fit underneath the integrated circuit die 50, then the components 14 can extend out past one or more sides of the die. In such a case, conductive contacts for the additional discrete components can be placed on the substrate 12 outside the perimeter of the attachment pads 13 for the die 50.

In an alternate embodiment, the tallest of the components 14 and spacers 26 can be positioned in other configurations that allow a stable base to be formed for the integrated circuit die. For example, the tallest components 14 and spacers 26 can be positioned at or near the mid-point along each edge of the substrate, forming a cross-shaped configuration of dimensions suitable to support all sides of the integrated circuit die 50. Other stable configurations can also be used. The end result is to provide a stable bonding support during wiring bonding operation from die 50 to pads 13 on the substrate 12.

FIGS. 2A and 2B are top plan and side elevation views of the integrated circuit package 10 of FIGS. 1A-1B, including an integrated circuit die 50. Die 50 has been positioned over and stacked on the discrete components 14 of the component layer in a "tent"-like configuration, in which a planar face of the die 50 rests on the surfaces of the tallest discrete components 14 and spacers 26 that are positioned on the substrate 12 such that the face of the die is substantially parallel to the surface of the substrate 12. The face of the integrated circuit die 50 is over or aligned with at least a portion of the component layer and the substrate surface area covered by the component layer. In the described embodiment, the die 50 covers most of the component layer, as shown. In other embodiments, the die may cover a smaller portion of the component layer, or the die may extend over parts of the surface area of the substrate that do not include discrete components.

Since the components and spacers all have substantially the same height, the die is provided with a stable platform that will not allow any substantial rocking or similar cantilever movement of the die. Such a stable position is important during the bonding of wires to the die connections. The die can be attached to the top surfaces of the tallest components and spacers using standard adhesives. Examples or adhesives are epoxies and acrylics, and they can be conductive or nonconductive. Solder bonding can also be used for this attachment, provided the joint interfaces are compatible for soldering).

After die 50 has been attached, the die is wirebond connected to the connection rows of pads 13 of the substrate using bond wires 52 to complete the package circuits. This is accomplished using a standard wirebonding process to connect the pads of die 50 to the pads of substrate 12. For example, bonding wires of 1-mil diameter can be used, or wires of an appropriate diameter for the package.

The resulting package provides a much higher packing density than the packages of the prior art, resulting in a smaller used substrate surface area and a smaller package size overall. The placement of discrete components under the integrated circuit die 50 permits effective package size reduction. The overall height of the package may be slightly greater than previous types of packages due to the stacked configuration, but this is not generally of concern for the small dimensions involved.

In alternate embodiments, additional dice similar to die 50 can be stacked on the die 50 using any of various well-known standard stacking configurations for dice.

In still another alternate embodiment, the integrated circuit die 50 can first be placed and connected to the substrate (via wirebonding or a flip-chip configuration, for example). In one such embodiment, the discrete components can be connected to an interconnect substrate that is positioned on the die between the die and the discrete components. Such an embodiment is described in greater detail in co-pending patent application Ser. No. 11/315,409, filed Dec. 22, 2005, entitled, "Method and System for Increasing Circuitry Interconnection and Component Capacity in a Multi-Component Package," which is incorporated herein by reference in its entirety.

Figure 3:
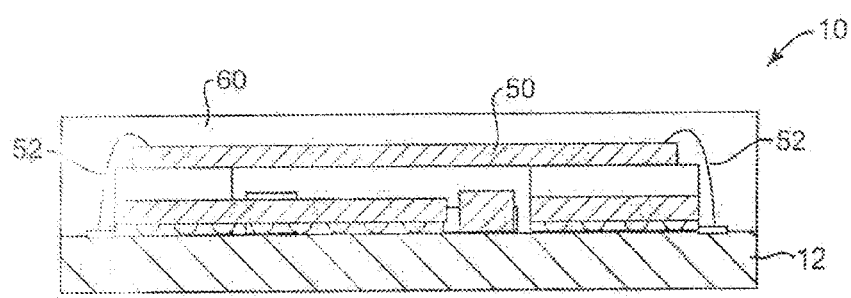
FIG. 3 is a side elevation view of the package of FIGS. 2A and 2B, with the addition of a protective encasing provided over the package.

FIG. 3 is a side elevation view of the package 10 of FIGS. 2A and 2B, with the addition of a protective encasing 60 provided over the die 50, wires 52, and substrate 12. The encasing 60 protects the delicate bond wires 52 from any external forces or interference. In one embodiment, the encasing 60 is an over-molded encasing that is formed using a standard encapsulation process, which fills in all the space surrounding the die 50 and wires 52 with a material such as an epoxy compound, and secures the bonding wires in place. In other embodiments, the encasing 60 can take other forms, e.g., a cap made of metal or other material that protects the die and wire connections.

Figure 4:
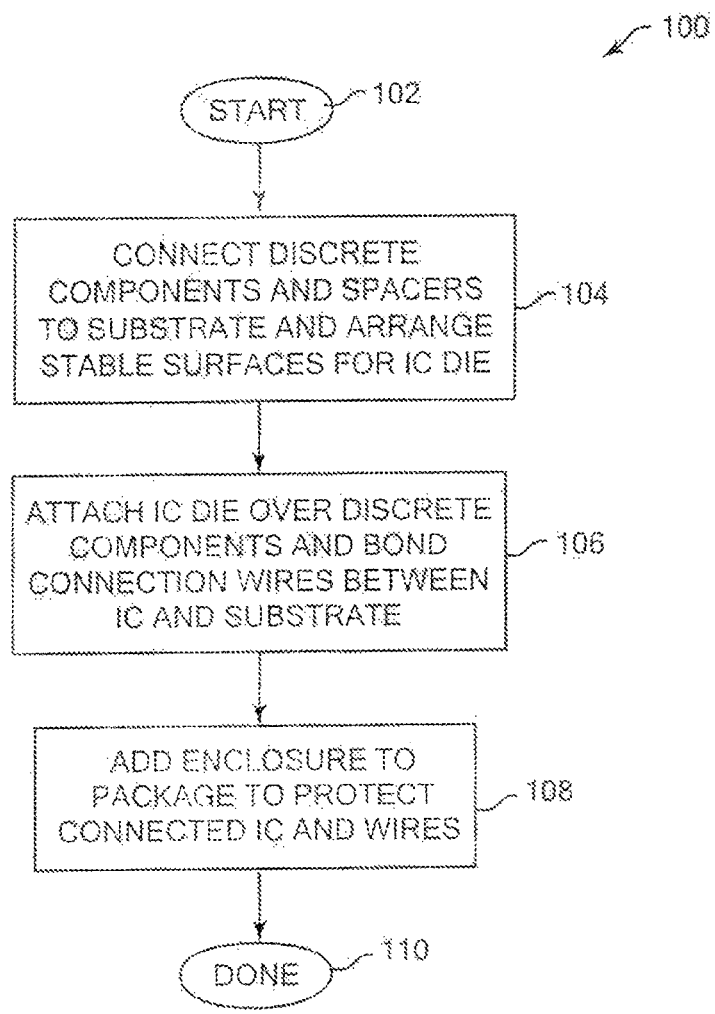
FIG. 4 is a flow diagram illustrating a method of the present invention for increasing the packing density of an integrated circuit package by stacking components.

FIG. 4 is a flow diagram illustrating a method 100 of the present invention for increasing the packing density of an integrated circuit package by stacking components. The method starts at 102, and in step 104, discrete components and spacers are connected to the substrate 12 and arranged to provide stable surfaces for the integrated circuit (IC) die 50. As described above, this can include positioning the tallest discrete components in the corners or along the edges of the substrate, and providing spacers 26 of the same height at any corners or edges not filled by the tallest components.

In step 106, the integrated circuit die is attached to the package by placing it over or adjacent to the discrete component layer, and attaching it to the surfaces of the tallest discrete components and spacers by an appropriate adhesive. After the die is placed and secured, the connection wires 52 are wirebonded between terminals of the die 50 and the connection pads of the substrate 12 to complete the package circuits. In some embodiments, other elements (components, layer, etc.) can be placed between the component layer and the die 50, but such elements can be considered part of the component layer so that the die 50 is still considered "adjacent" to the component layer.

In step 108, the enclosure 60 is added to the package 10 to protect and stabilize the connections of the fragile bonding wires as well as protect the integrated circuit and other components of the package. The method is then complete at 110.

In alternative embodiments, the steps of FIG. 4 can be performed in a different order. For example, if the integrated circuit die 50 is positioned underneath the component layer, then the die can first be placed on the substrate, followed by placing an interconnect substrate onto the die, and the discrete components on the interconnect substrate. An IC die can then be placed on top of the tallest discrete components and then wirebonded down to the substrate bond pads.

It should be noted that the present invention can be suitable for a variety of different package configurations, discrete components, and integrated circuits of a package. Any system-in-chip package designs including discrete components can benefit from the increased packing density of the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The invention claimed is:

1. A method for forming an integrated circuit package, the method comprising:
   placing a plurality of discrete components on a substrate, the plurality of discrete components including a first discrete component and a spacer, the first discrete component and the spacer having approximately the same height in a direction perpendicular to the substrate;
   placing an integrated circuit die atop the plurality of discrete components, the integrated circuit die comprising first and second corners, wherein placing the integrated circuit die comprises positioning the first corner over the first discrete component and positioning the second corner over the spacer, thereby balancing the integrated circuit die against the first discrete component and the spacer; and
   bonding one or more connection wires between the integrated circuit die and the substrate.

2. The method of claim 1, wherein placing the integrated circuit die atop the plurality of discrete components comprises placing the integrated circuit die atop the plurality of discrete components such that the first discrete component supports the integrated circuit die at a first edge of the integrated circuit die and the spacer supports the integrated circuit die at a second edge of the integrated circuit die opposite the first edge.

3. The method of claim 2, wherein the first discrete component supports the integrated circuit die at or near a first mid-point of the first edge, and wherein the spacer supports the integrated circuit die at or near a second mid-point of the second edge.

4. The method of claim 1, wherein placing the integrated circuit die atop the plurality of discrete components comprises attaching the integrated circuit die to the spacer using conductive epoxy.

5. The method of claim 1, wherein the integrated circuit die is rectangular and further comprises third, and fourth corners, and wherein placing the integrated circuit die atop the plurality of discrete components comprises positioning the third corner over a second discrete component, and the fourth corner over a third discrete component.

6. The method of claim 1, wherein the integrated circuit die is rectangular and comprises first, second, third, and fourth corners, and wherein placing the integrated circuit die atop the plurality of discrete components comprises positioning the first corner over the first discrete component, the second corner over the spacer, the third corner over a first additional spacer, and the fourth corner over a second additional spacer.

7. The method of claim 1, wherein the integrated circuit die is rectangular and comprises first, second, third, and fourth corners, and wherein placing the integrated circuit die atop the plurality of discrete components comprises positioning the first corner over the first discrete component, the second corner over the spacer, the third corner over a second discrete component, and the fourth corner over a second spacer.

8. The method of claim 1, wherein the plurality of discrete components includes a second discrete component having a different height in the direction perpendicular to the substrate shorter than the same height of the first discrete component and the space.

9. The method of claim 1, wherein the plurality of discrete components includes at least one passive component and at least one active component.

10. The method of claim 1, further comprising providing an enclosure over the integrate circuit die, discrete components, and substrate.

11. The method of claim 1, wherein bonding the one or more connection wires comprises bonding the one or more connection wires from one or more terminals of the integrated circuit to one or more connection pads of the substrate.

12. The method of claim 1, further comprising stacking one or more additional dice onto the integrated circuit die.

13. The method of claim 1, wherein the spacer is a passive block comprised of at least one of silicon, copper, or polymer.

* * * * *